United States Patent
Schatzberger (10) Patent No.: US 7,602,640 B2
(45) Date of Patent: Oct. 13, 2009

(54) NON-VOLATILE STORAGE ELEMENT

(75) Inventor: Gregor Schatzberger, Graz (AT)

(73) Assignee: Austriamicrosystems AG, Unterpremstätten (AT)

( * ) Notice: Subject to any disclaimer, the term of this patent is extended or adjusted under 35 U.S.C. 154(b) by 17 days.

(21) Appl. No.: 11/576,082

(22) PCT Filed: Sep. 14, 2005

(86) PCT No.: PCT/EP2005/009881

§ 371 (c)(1),
(2), (4) Date: Nov. 14, 2007

(87) PCT Pub. No.: WO2006/034782

PCT Pub. Date: Apr. 6, 2006

(65) Prior Publication Data

US 2008/0165583 A1    Jul. 10, 2008

(30) Foreign Application Priority Data

Sep. 27, 2004    (DE) ................ 10 2004 046 793

(51) Int. Cl.
*G11C 16/04*    (2006.01)
(52) U.S. Cl. .................. 365/185.07; 365/189.04; 365/189.02; 365/233.16; 365/233.17; 365/233.19
(58) Field of Classification Search ........... 365/185.07, 365/189.04, 189.02, 233.16, 233.17, 233.19
See application file for complete search history.

(56) References Cited

U.S. PATENT DOCUMENTS

| | | | |
|---|---|---|---|
| 4,132,904 A | 1/1979 | Harari | |
| 4,348,745 A | 9/1982 | Schmitz | |
| 5,523,971 A | 6/1996 | Rao | |
| 5,648,930 A | 7/1997 | Randazzo | |
| 5,757,696 A | 5/1998 | Matsuo et al. | |
| 6,411,545 B1 | 6/2002 | Caywood | |
| 2002/0031028 A1 | 3/2002 | Forbes et al. | |
| 2006/0158925 A1* | 7/2006 | Cuppens | 365/154 |

OTHER PUBLICATIONS

Search Report for PCT/EP2005/009881.
Written Opinion for PCT/EP2005/009881.
Office Action from corresponding German Application No. 10 2004 046 793.5-55, mailed Jun. 13, 2005, 2 pages.

* cited by examiner

*Primary Examiner*—Thong Q Le
(74) *Attorney, Agent, or Firm*—Fish & Richardson P.C.

(57) ABSTRACT

A non-volatile storage element includes a first data terminal and a second data terminal, a first MOS transistor and a second MOS transistor, the first MOS transistor and the second MOS transistor having a first conductivity type, a third MOS transistor and a four MOS transistor, the third MOS transistor and the fourth MOS transistor having floating gates and having a second conductivity type, and a fifth MOS transistor and a sixth MOS transistor having the second conductivity type.

20 Claims, 6 Drawing Sheets

NON-VOLATILE STORAGE ELEMENT

TECHNICAL FIELD

This patent application relates to a non-volatile storage element.

BACKGROUND

Storage elements as described in the present application are often known as "latches". These are re-writable, non-volatile storage elements used for storing small amounts of data. Normally the amount of data ranges from 1 bit up to several 100 bits. The data is retained even if the power supply to the storage element is switched off. A large number of such storage elements are frequently used in electronic integrated circuits. The surface area occupied by one storage element should therefore be as small as possible.

Non-volatile memories are already known. In these non-volatile standard memories, complex addressing is used with correspondingly complex circuit components. In addition, a sense amplifier is needed in order to be able to read out data from the non-volatile memory. The use of non-volatile standard memories is therefore relatively complex and occupies a large surface area.

U.S. Pat. No. 6,411,545 discloses a non-volatile latch in which a source-coupled storage element and two write inputs are provided on the high-voltage side, plus an isolated data output.

U.S. Pat. No. 5,648,930 discloses a non-volatile latch having drain-coupled storage elements as typically provided in a RAM. The latches comprise a data input and a data output. They are programmed via power busses.

U.S. Pat. No. 5,523,971 discloses a non-volatile latch comprising eight transistors. The non-volatile latch is isolated from the supply voltage during the programming operation.

U.S. Pat. No. 4,132,904 discloses a non-volatile latch, which has the disadvantage, however, that when data is read out again it is inverted compared to the previously written data.

U.S. Pat. No. 4,348,745 discloses a non-volatile latch, which requires twelve transistors and a programming voltage of 17 V, which makes this latch relatively complex.

SUMMARY

A non-volatile storage element uses a first transistor pair comprising floating-gate MOS transistors, with the floating gate of each transistor being capacitively coupled to the drain terminal of the other transistor of the transistor pair. The source terminals of the floating-gate transistors are connected to a second transistor pair of the same conductivity type. The gate terminals of this transistor pair are connected together. In write mode, the gate terminals are driven so that both transistors are high impedance and thus isolate the floating-gate transistors from the standard low-voltage supply. In order to achieve reliable isolation from the standard low-voltage supply, the well terminals of the second transistor pair are taken to the maximum potential during the write operation. In a read mode, both transistors are driven so that they are low impedance; the well terminals of the transistor pair are then connected to the low-voltage supply. The drain terminals of the floating-gate transistors are connected to the drain terminals of a third transistor pair, where these transistors have the opposite conductivity type. The gate terminals of the third transistor pair are cross-coupled to the drain terminals of the respective other transistor. The storage element requires only a small number of transistors and can be controlled easily, because for the write operation, only one voltage condition is required both to charge the one floating gate and to discharge the other floating gate.

In a first embodiment, the drain terminals of the floating-gate transistors are connected to a fourth transistor pair of the same conductivity, which are connected between the first transistor pair and the third transistor pair. The gate terminals of the transistors of the fourth transistor pair are connected together. Data terminals forming data outputs are provided between the transistors of the third and fourth transistor pairs. In write mode, the gate terminals are driven so that both transistors are high impedance and hence isolate the floating-gate transistors from the data outputs. In addition, the well terminals of the transistor pair are connected to the maximum potential during write mode. In read mode, both transistors are driven so that their channels are low impedance. At the same time, the well terminals of the transistor pair are connected to the standard low-voltage supply. The transistors of the second and fourth transistor pairs are driven by the same signal. This ensures that the outputs and the standard low-voltage supply are isolated from a high voltage applied to the inputs in write mode.

In a second embodiment, additional transistors of the same conductivity type are arranged in parallel with each transistor of the third transistor pair. In write mode, these transistors are driven so that the outputs of the storage element are shorted to the reference potential. In read mode, both transistors are driven so that they are non-conducting. The gate terminals of both transistors are connected together.

In write mode, the floating-gate transistors are isolated both from the standard low-voltage supply and from the outputs by the high-impedance transistors of the second and fourth transistor pairs. Data can be written to the storage element by applying a moderate high-voltage to the drain terminal, the source terminal and the substrate of the first floating-gate transistor and to the gate terminal of the second floating-gate transistor. In the second floating-gate transistor, the drain terminal, the source terminal and the substrate are taken to ground, and in the first floating-gate transistor the gate terminal is taken to ground. These voltage conditions enable electrons to tunnel from the drain, source and substrate regions to the floating-gate of the second floating-gate transistor, while in the first floating-gate transistor they enable electrons to tunnel from the floating gate to the drain, source and substrate regions. These current flows result in the floating gate of the first transistor being positively charged, and the floating gate of the second transistor being negatively charged. The outputs of the storage elements are meanwhile shorted together.

In read mode, the second and fourth transistor pairs are switched to be conducting by connecting the gate terminals to ground. During write mode, the fifth transistor pair, which shorts the outputs to ground, is opened. If all the voltage conditions exist as described, the described structure forms two cross-coupled inverters having different trigger points depending on the charge on the floating gates. One floating-gate transistor starts to conduct before the other, with the result that the cross-coupled inverters go into a state in which one output is High and the other output is Low.

An arrangement having a time-based self-monitoring facility can be implemented by the storage element according to the second embodiment by using an additional OR-gate that is connected to the data outputs of the storage element. In write mode the outputs are taken to ground, as described above, so that the output of the OR-gate is also at ground potential. In read mode, one output is at the operating voltage potential (High) and the other output is at ground potential (Low), according to the charge on the floating gates of the first and second floating-gate transistors. A change at the outputs of the storage element thus causes a change at the output of the OR-gate from ground potential (Low) to the operating-voltage potential (High).

An automatic power-saving mode of the non-volatile storage element can be implemented using the output signal of the OR-gate and a few additional logic devices. The power-saving mode has the advantage of improved data-retention performance of the non-volatile storage element compared with the standard read mode. The automatic power-saving mode is described in more detail below with reference to an exemplary embodiment.

The storage element forms a non-volatile storage element that consumes only a leakage current in write mode, in power-saving mode and also in read mode, once the outputs of the storage element have assumed the programmed state.

The storage element has a number of advantages in its various embodiments. A first advantage is that after switching on the storage element, a logic signal corresponding to the charges on the floating-gate transistors exists at its outputs. A second advantage is that during write mode, the memory cells are completely isolated from the standard low-voltage supply and the data outputs. A third advantage is that the memory cells can be read out using a time-based self-monitoring facility. This means that the storage element is itself able to identify when a logic decision is made. A further advantage is that the output voltage of the non-volatile storage element always lies within the range of the low-voltage supply in read mode and write mode. In read mode, there is no voltage drop $V_{th}$. In write mode, a high voltage as used for programming does not appear at the data outputs of the non-volatile memory element, so that standard logic elements can be used at the outputs of the storage element.

The storage element is described in further detail below with reference to exemplary embodiments.

DETAILED DESCRIPTION

A storage element is described below with reference to exemplary embodiments, where the exemplary embodiments are in no way restrictive. Further embodiments of are possible and covered by the claims.

Figure 1:
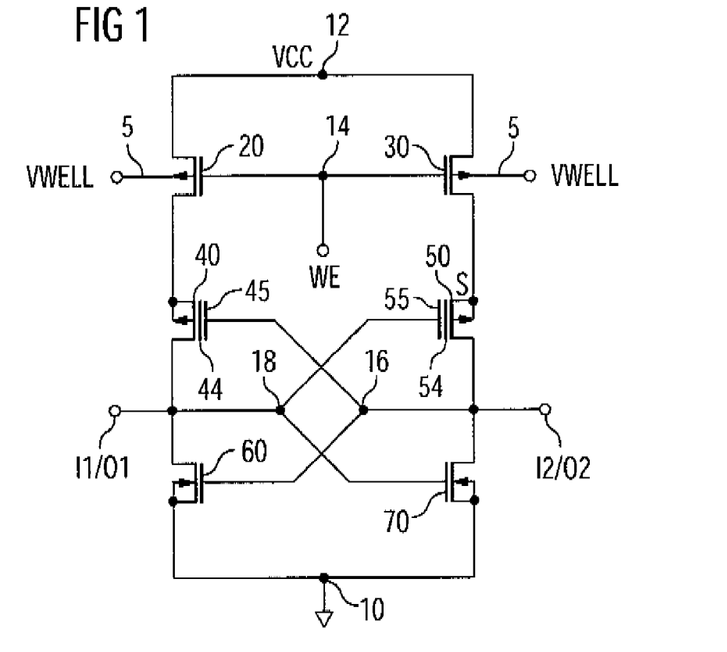
FIGS. 1 and 2 show circuit diagrams of a non-volatile storage element, where the floating-gate transistors are isolated from the positive supply voltage.
Figure 2:
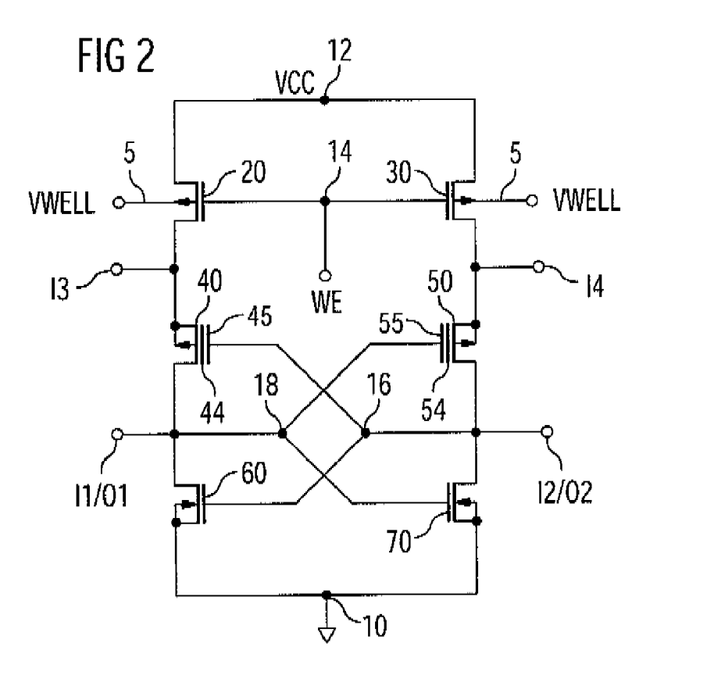

FIGS. 1 and 2 show two circuit diagrams of storage elements of the type described herein. The circuit comprises a transistor pair having p-channel transistors 40 and 50, which each have floating gates 44 and 54. The transistors 40 and 50 have control gates 45 and 55, which are capacitively coupled to the floating gates 44 and 54. The control gate 45 of the first floating-gate transistor 40 is connected to the drain terminal of the other floating-gate transistor 50, while the control-gate terminal 55 of the transistor 50 is connected to the drain terminal of the transistor 40, resulting in a cross-coupled arrangement. The source terminals of the floating-gate transistors 40 and 50 are connected to their own n-type substrate.

A third and fourth transistor 20 and 30 form a second transistor pair whose drain terminals are connected to the source terminals of the transistors 40 and 50. The source terminals of the second transistor pair are connected to a supply-voltage terminal 12, and a supply voltage VCC is supplied to them thereby. The gate terminals are connected together and connected to a first control-signal line 14, whereby a first control signal WE can be applied to them. An external control unit (not shown) is provided to generate the control signal WE.

The well terminals are connected together and connected to a third control-signal line 5. In write mode, a moderate high-voltage, which is also used to program the floating-gate transistors, is applied to this terminal. In read mode, the well terminals are connected to the standard low-voltage supply VCC. An external control unit (not shown) is used to generate the control signal VWELL.

The drain terminals of transistors 40 and 50 are connected to the drain terminals of a third transistor pair comprising a fifth transistor 60 and a sixth transistor 70. The drain terminals of the first and fifth transistors 40 and 60, and the gate terminal of the sixth transistor 70, are connected to a first data terminal I1/O1, which forms both a data input and a data output. Correspondingly, the drain terminals of the second and sixth transistors 50 and 70, and the gate terminal of the fifth transistor 60, are connected to a second data terminal I2/O2, which likewise forms both a data input and a data output. The source terminals of the third transistor pair are connected to the reference-potential terminal 10.

In the embodiment of FIGS. 1 and 2, in write mode, the programming voltage is applied to the first data terminal I1/O1 or to the second data terminal I2/O2 depending on the programming required. In read mode, the output signal at the first data terminal I1/O1 is determined by the drain terminals of the transistors 40 and 60, while the signal at the second data terminal I2/O2 is determined by the drain terminals of the transistors 50 and 70.

In write mode, a supply voltage VCC equal to the standard operating-voltage for the technology used is applied to the first supply-voltage terminal 12. A programming voltage VPP provides the control signal WE at the first control terminal 14 and the control signal VWELL at the third control-signal line 5, so that the third transistor 20 and the fourth transistor 30 are non-conducting. The programming voltage equals 10 V to 14 V, depending on the coupling factor between the floating gates and the control gates, and on the thickness of the tunnel oxide layer. The programming voltage VPP must be applied to the first data terminal I1/O1 in order to save data signals in the storage element. When this is the case, the n-channel transistor 70 starts to conduct, the floating-gate transistor 50 stops conducting, and the second data terminal I2/O2 is pulled to ground. By terminal I2/O2 being at ground potential, the first floating-gate transistor 40 starts to conduct, while the n-channel transistor 60 is non-conducting. No DC current flows through the storage-element arrangement in this situation. The control gate 45 of the floating-gate transistor 40 is pulled to ground, although the voltage can also be applied externally via the second data terminal I2/O2. The control gate 55 of the second floating-gate transistor 50 is meanwhile at the programming voltage VPP. The potential difference causes electrons to tunnel from the floating gate 44 to the channel of the transistor 40, so that the floating gate becomes positively charged.

At the same time, the programming voltage VPP is applied to the control gate 55 of the second floating-gate transistor 50, and the drain terminal is pulled to ground. The potential difference between the control gate 55 and the floating gate 54 causes electrons to tunnel from the drain region to the floating gate 54, whereby it becomes negatively charged.

Owing to the symmetry of the circuit, for the write operation only one voltage condition is required both to charge the one floating gate and to discharge the other floating gate.

Two additional data terminals I3 and I4, which form data inputs and hence are also referred to below as input terminals, are provided in the embodiment of FIG. 2. In write mode, the data terminal I3 is connected by a low-impedance path to the data terminal I1/O1, while the data terminal I4 is connected by a low-impedance path to the data terminal I2/O2. Both substrates are thereby at the potential for write mode. If data is written into the storage element in the manner described, a tunnel current flows from the channel of the one transistor to the associated floating gate, and from the floating gate of the other transistor to the channel belonging to this transistor.

At the end of the write access, the floating gate 44 of the first transistor 40 is positively charged, and the floating gate 54 of the second transistor 50 is negatively charged, according to the described example.

In read mode, the control signal VWELL is switched to the supply voltage VCC, the control signal WE is taken to ground, and the second transistor pair comprising transistors 20 and 30, which is connected to the first supply-voltage terminal 12, starts conducting. The transistor having the positively charged floating gate does not conduct, while the transistor having the negatively charged floating gate is conducting. In the above example, transistors 20 and 30 are conducting when the control signal WE is taken to ground, and the control signal VWELL is connected to the supply voltage VCC. The second transistor 50 is conducting and the first transistor 40 is non-conducting. The current flowing through the second transistor 50 charges the node 16 at the second data terminal I2/O2 with a positive charge, so that the fifth transistor 60 starts to conduct. The control gate 55 of transistor 50 is thereby pulled to ground, because transistor 40 is non-conducting. When the control gate 55 is at ground potential, the transistor 70 is non-conducting, and the full voltage VCC at the first supply terminal 12 is applied to the control gate 45.

If the floating gates were charged with the opposite charge by swapping over the input signals to the data terminals I1/O1 and I2/O2, then in read mode, inverse signal states are obtained also as output signals at the data terminals I1/O1 and I2/O2.

Figure 3:
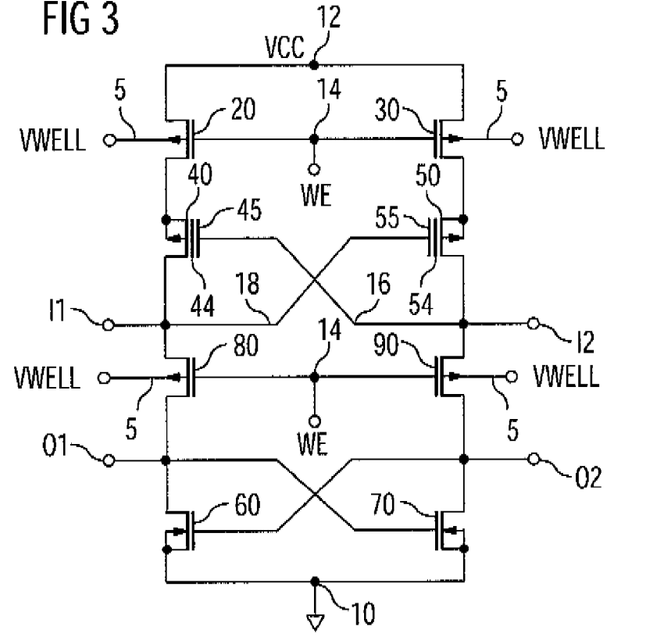
FIGS. 3 and 4 show circuit diagrams of an embodiment of the non-volatile storage element, where the floating-gate transistors are additionally isolated from the data outputs.
Figure 4:
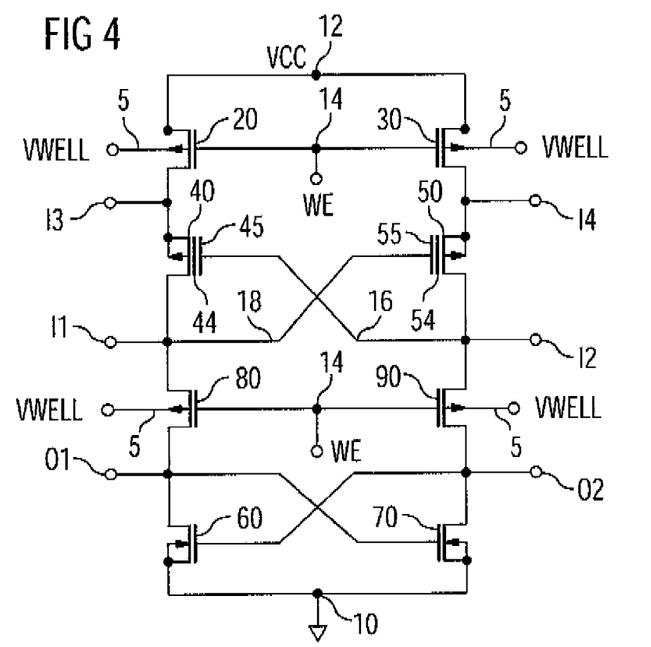

FIGS. 3 and 4 show an embodiment of the circuit arrangement described herein. Whereas in the embodiment shown in FIGS. 1 and 2, the first and second data terminal I1/O1 and I2/O2 each have a function both as a data input and as a data output, in the embodiments shown in FIGS. 3 and 4, additional, isolated data terminals are provided. The data terminals connected to the drain terminals of the floating-gate transistors 40 and 50, and which are labeled I1/O1 and I2/O2 in FIGS. 1 and 2, only have a data-input function in the storage elements described below, and are hence also labeled as input terminals with the references I1 and I2 in this exemplary embodiment, while separate data terminals O1 and O2 are provided that form outputs and hence are also referred to below as output terminals. The outputs O1 and O2 can thereby be isolated from the programming voltage VPP.

In both the circuit arrangements shown, an additional fourth transistor pair is provided for this purpose comprising p-channel transistors 80 and 90. The transistors 80 and 90 are arranged in a similar manner to the second transistor pair comprising transistors 20 and 30, which isolates the floating-gate transistors 40 and 50 from the supply voltage of the first supply-voltage terminal 12. The gate terminals of the additional transistors 80 and 90 are connected together, and are also driven by the control signal WE supplied via the control-signal line 14. The well terminals of the two transistors are connected together and are similarly driven by the control signal VWELL supplied via the control-signal line. The source terminals of these two transistors are connected to the drain terminals of the cross-coupled floating-gate transistors 40 and 50. The drain terminals of transistors 80 and 90 are connected to the drain terminals of the cross-coupled n-channel transistors 60 and 70.

In write mode, the control signals WE and VWELL are at the programming voltage VPP, and the second and fourth transistor pairs comprising transistors 20, 30, 80 and 90 are non-conducting. The cross-coupled floating-gate transistors 40 and 50 are fully isolated from the supply voltage VCC at the first supply-voltage node 12. They are also isolated from the output terminals O1 and O2. The voltages at the two input terminals I1 and I2 must be set externally as described above. By the outputs being isolated from the programming voltage VPP, the cross-coupled n-channel transistors 60 and 70 can be implemented as standard low-voltage transistors, so that they can be fabricated in a base process. The output levels at the output terminals O1 and O2 always lie within a low-voltage range between ground and the supply voltage. Logic devices connected to the outputs of the storage element can thus be implemented by standard logic gates, which can also be fabricated in the base process.

Input terminals I3 and I4 have been added in FIG. 4. In write mode, the input terminal I3 is connected by a low-impedance path to the input terminal I1, and the input terminal I4 is connected by a low-impedance path to the input terminal I2. In read mode, both inputs are at a floating potential.

Figure 5:
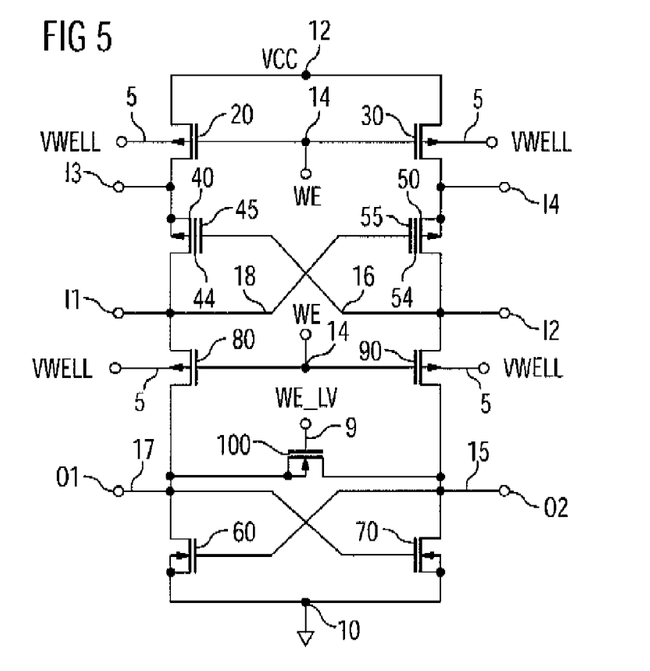
FIG. 5 shows a circuit diagram of an embodiment of the non-volatile storage element having a precharge device.
Figure 6:
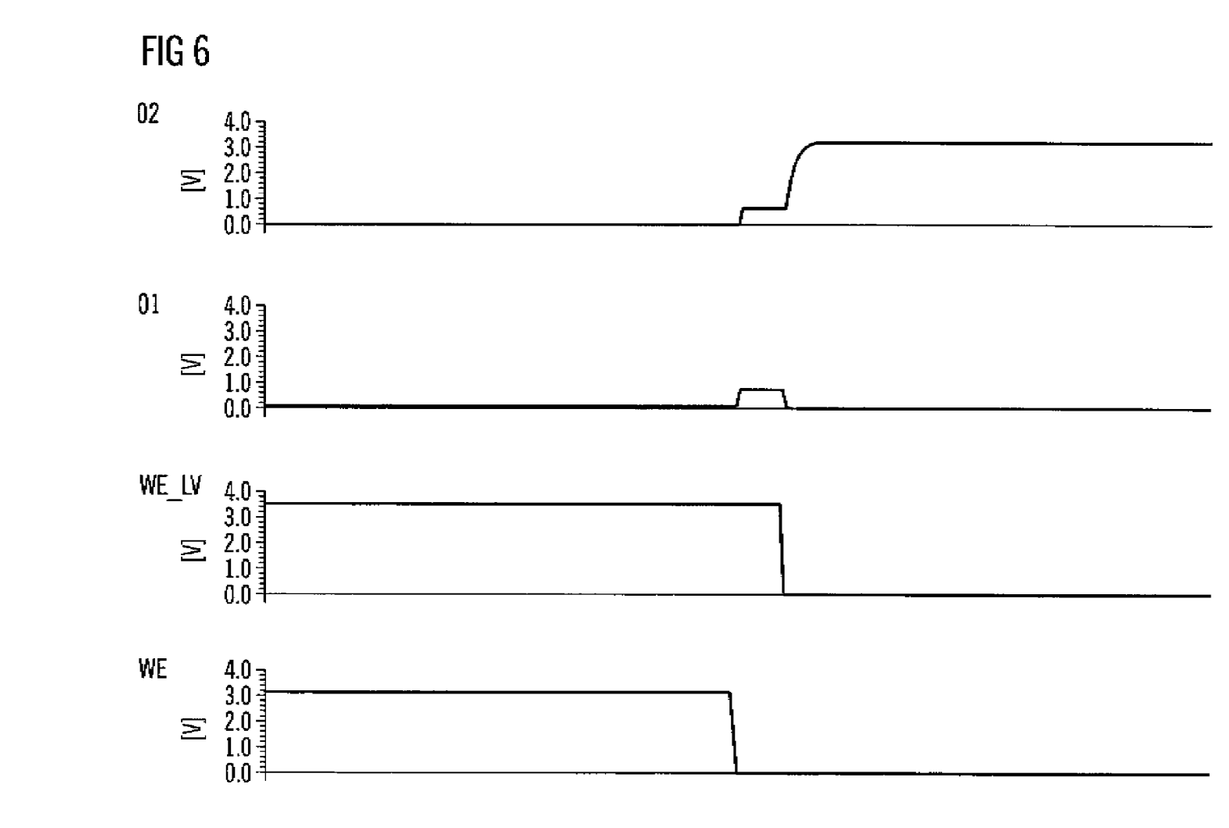
FIG. 6 shows a signal diagram depicting signal waveforms for the circuit of FIG. 5.

FIG. 5 shows a circuit arrangement according to another embodiment, which employs a precharge approach in order to obtain a more sensitive storage element. An n-channel transistor 100 is added to the circuit arrangement of FIG. 4. The drain terminal of this transistor is connected to the output terminal O2, and the source terminal to the output terminal O1. A second control signal WE_LV, which is also generated by the external control unit, is applied to the gate via a second control-signal line 9. The waveforms of the control signals WE and WE_LV and of the signals at the output terminals O1 and O2 are shown in FIG. 6.

In write mode, the control signal WE_LV is at the supply voltage VCC, the transistor 100 is conducting, and the output terminals O1 and O2 are connected together by a low-impedance path, so that both output terminals O1 and O2 have the same potential. The data is stored in the non-volatile storage element, as described with reference to FIG. 4. To switch from write mode to read mode, the signal WE is taken to ground, the control signal VWELL is taken to the supply voltage VCC, and the transistors 20, 30, 80 and 90 of the second and fourth transistor pairs are conducting. The floating-gate transistor 40 has a positive charge, and the transistor 50 has a negative charge. The floating-gate transistor 50 thereby starts to conduct, and the potential at the output terminals O1 and O2 rises. The cross-coupled transistor pair comprising transistors 60 and 70 thus starts to conduct. The second control signal WE_LV is taken to ground after a short delay. The gate of the n-channel transistor 60 is driven by VCC, and the output terminal O1 is thereby pulled to ground. By the output terminal O1 being at ground potential, the n-channel transistor 70 stops conducting, and the second output terminal O2 is raised to VCC.

Very small charge differences on the floating gates of the transistors 40 and 50 can be evaluated by the circuit arrangement described above. The read-out speed is thereby increased for a storage element designed according to this embodiment.

Figure 7:
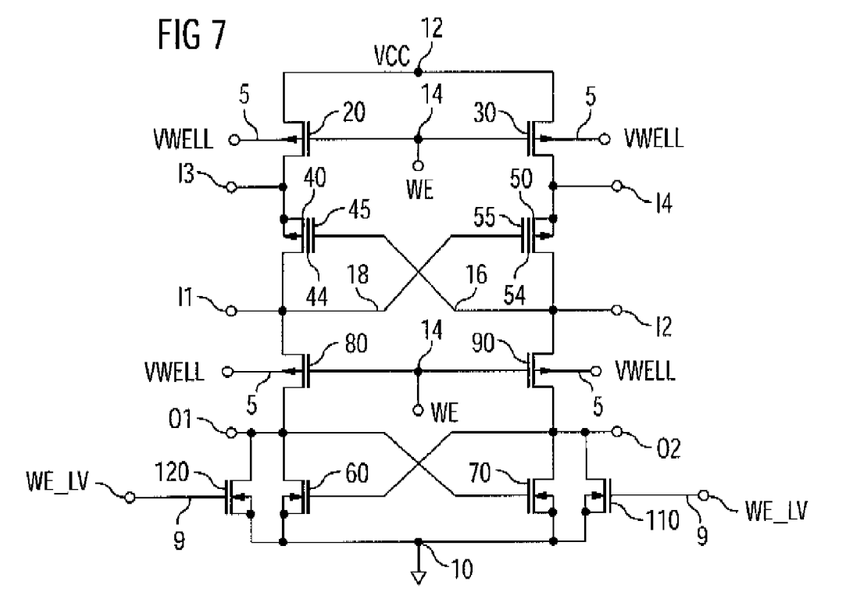
FIG. 7 shows a circuit diagram of a development of the non-volatile storage element having an output-level monitoring facility in write mode.

FIG. 7 shows an embodiment of the circuit arrangement employing a time-based self-monitoring facility for initializing a storage element, which can detect a signal change at its outputs by very simple means. The described, non-volatile storage element is also more sensitive to small differences in charge on the floating gates than the circuit arrangement of FIG. 4. A comparison of the circuit arrangement in FIG. 5 and the circuit arrangement in FIG. 7 shows that two additional n-channel transistors 110 and 120 are provided. The ninth transistor 100 is no longer provided. The drain terminal of the transistor 120 is connected to the output terminal O1, and the source terminal is connected to ground. The drain terminal of the transistor 110 is connected to the output terminal O2, and the source terminal is connected to ground. The second control signal WE_LV is applied via second control-signal lines 9 to the gate terminals of the two transistors 110 and 120.

In write mode, the control signal WE_LV is at the supply voltage VCC, both transistors 110 and 120 are conducting, and the outputs are at ground potential. Data can be written to the storage element in the manner described with reference to FIG. 4. In the described example, the floating-gate transistor 50 is negatively charged, and the floating gate of the transistor 40 is positively charged.

At the end of a write pulse, the signal WE goes to ground potential, the control signal VWELL goes to the supply voltage, and the second and fourth transistor pairs comprising transistors 20, 30, 80 and 90 start to conduct. When the second control signal WE_LV goes to VCC, the potential at the respective drain and gate terminals of the floating-gate transistors 40 and 50 go to ground potential. The transistor 50 is conducting and the transistor 40 is non-conducting.

Figure 8:
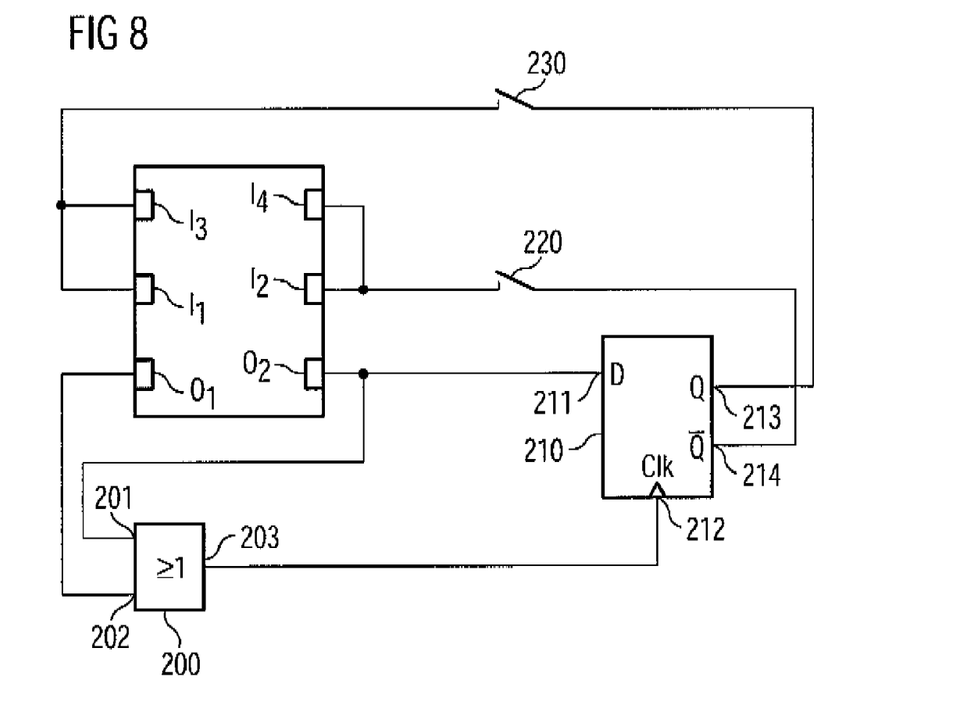
FIG. 8 shows an arrangement comprising the storage element of FIG. 7, an OR-gate and a flip-flop to form a time-based self-monitoring facility.

FIG. 8 shows a circuit in which a simple circuit has been added to the storage element described previously. In this case, the two output signals from the non-volatile storage element are taken to a single OR-gate 200. The output signal from the OR-gate 200 is "0" when both input signals are at "0".

Figure 9:
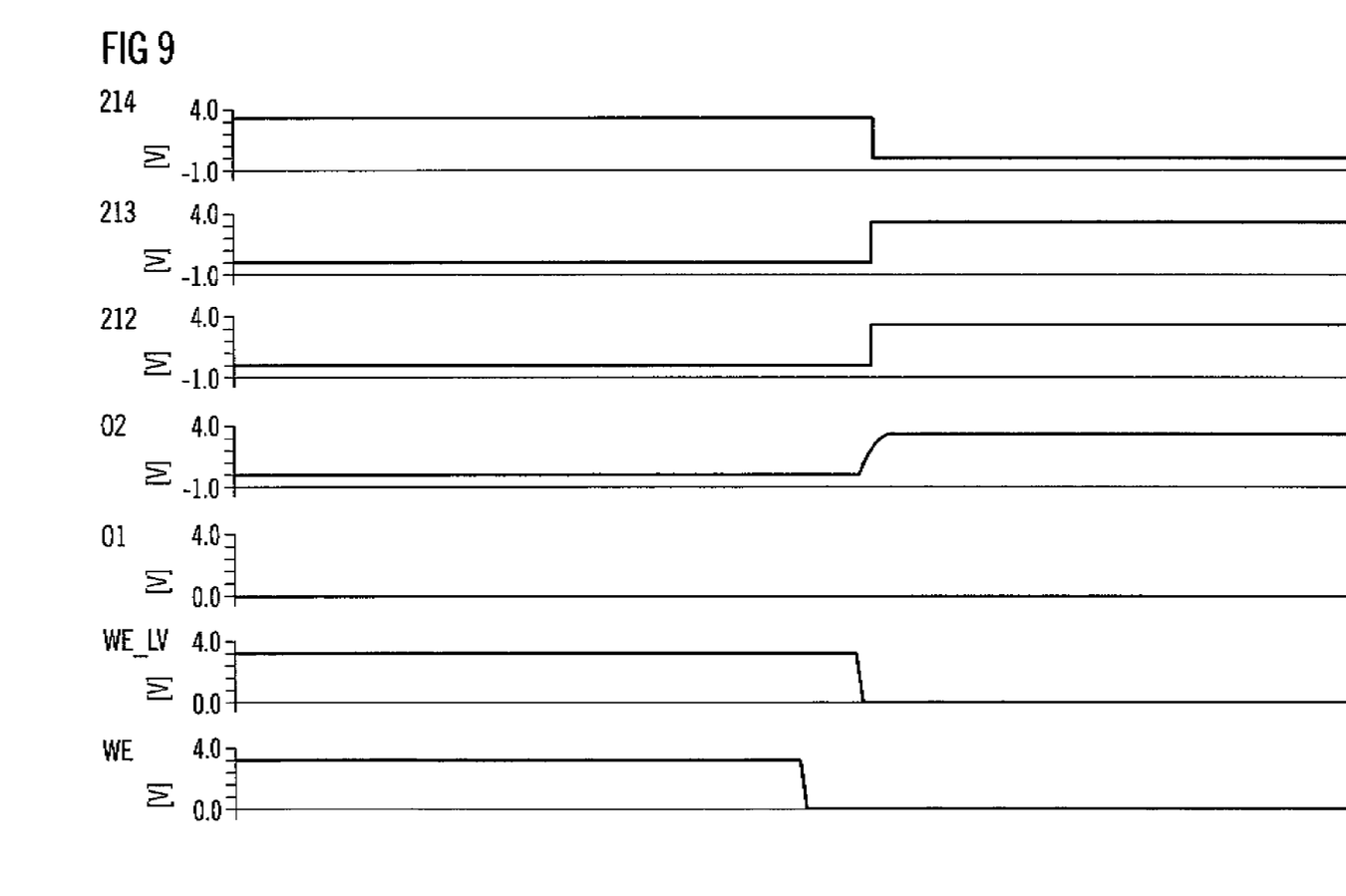
FIG. 9 shows a signal diagram depicting signal waveforms for the circuit of FIG. 8.

At the end of a write pulse, once the first control signal WE has gone to ground potential, and the third control signal has gone to the supply voltage, after a short delay the second control signal WE_LV also goes to ground potential. The waveforms are shown in FIG. 9. The voltage at the second output terminal O2 thereby rises to VCC, while the voltage at the first output terminal O1 falls to ground potential. This causes the output signal of the OR-gate to switch from "0" to "1", because now one of the input signals is at "1", and the other at "0". A signal change at the outputs of the storage element described can thereby be detected.

This fact can be used to transfer the non-volatile storage element into a power-saving mode, once the stored data has been transferred to a standard flip-flop 210 connected to the storage element. For example, the output signal of the OR-gate 200 can trigger a flip-flop 210, which adopts the data from the non-volatile storage element as shown in FIG. 8.

In order to explain how it works, it is assumed that the first output terminal O1 is at the "0" level, and the second output terminal O2 is at the "1" level. The D-input 211 of the flip-flop 210 is at a level "1" corresponding to that at the connected output terminal O2. The two output signals of the storage element are OR-ed by the OR-gate 200, so that if the output signals from the storage element change, a signal having a rising edge is produced by the OR-gate 200, which is supplied as a clock signal to the clock input 212 of the flip-flop 210. Owing to the switching delay of the OR-gate 200, the clock signal reaches the clock input 212 after the data signal reaches the input 211. The flip-flop 210 is thus set with confidence.

For a "1" at the output 213 of the flip-flop 210, a "1" is applied to the inputs I1 and I3, while a "0" is applied to the inputs I2 and I4. This corresponds to the original programming, so that the state of the storage element is retained.

Once the data has been saved in the flip-flop 210, the non-volatile storage element is taken into a power-saving mode. In this mode, the first control signal WE and the third control signal VWELL are taken to the supply voltage VCC, the transistors 20, 30, 80 and 90 are thereby non-conducting and the floating-gate transistors 40 and 50 are isolated from the supply voltage VCC. The transistors 40 and 50 are also isolated from the output terminals O1 and O2. If the second control signal WE_LV goes to VCC, both n-channel transistors 110 and 120 start to conduct and the output terminals O1 and O2 go to ground potential. The levels of control signals WE and WE_LV thus equal the levels in write mode.

The output 213 of the flip-flop 210 is connected to the input terminals I1 and I3. The complementary output 214 of the flip-flop 210 is connected to the input terminals I2 and I4. The switches 220 and 230 shown in FIG. 8 are closed for this purpose. In the power-saving mode described above, the non-volatile storage element consumes only a leakage current.

The power-saving mode comes to an end when modified data is to be written to the storage element. To do this, the switches 220 and 230 are first opened to prevent a high voltage, which is used for the write operation and is applied to the input terminals I1, I2, I3 or I4 of the storage element, from reaching the outputs 213 and 214 of the flip-flop 210. The new data can then be written as described above.

The drive signals for the switches 220 and 230, like the control signals WE, VWELL and WE_LV, are provided by an external control unit.

As an alternative to the terminal connections described for the storage element and the flip-flop 210, the third data terminal O1 can obviously also be connected to the data input 211 of the flip-flop 210. The connections from the outputs 213 and 214 would need to be swapped over accordingly.

To understand a further advantage of the power-saving mode regarding data retention, it is important to consider the voltage conditions in the standard read mode and in the power-saving mode. In the power-saving mode, the control gate 55 of the transistor 50, which is connected to the node 18, is taken to the supply voltage VCC, and the channel region is connected to ground. The floating gate 54 remains negatively charged, corresponding to its programming in the aforementioned example, even if the floating gate is discharged to VCC after a long period of time as a result of a gate-channel leakage current. The control gate of the transistor 40, which is connected to the node 16, is taken to ground potential, and the channel region to VCC. The floating gate 44 of the transistor 40 remains positively charged, even if the floating gate is discharged to ground after a long period of time as a result of leakage currents. The originally programmed data is retained in power-saving mode despite leakage currents and thermal stresses.

In standard read mode, the control gate 55 of the transistor 50 is at ground potential, and the channel region is at VCC. The floating gate 54 of the transistor 50 will become positively charged after a long period of time owing to leakage currents between the gate and the channel. The floating gate 54 in the aforementioned example was originally negatively programmed, however. The control gate 45 of the transistor 40 lies at VCC, and the channel region at ground potential. The floating gate 44 will become negatively charged after a long period of time owing to gate-channel leakage currents, although it was originally positively programmed. This results in a reversal of the originally programmed states owing to the gate-channel leakage current and thermal stresses, so that the stored data is lost.

Thus unlike the standard read mode, in power-saving mode there are no problems with retaining data over a long period of time.

Exemplary embodiments and applications have been described for standard CMOS n-type substrate processes. It is equally possible to fabricate storage elements as n-channel floating-gate transistors in a p-type substrate CMOS process. All embodiments can be adapted easily in order to retain the same functions in a p-type substrate process.

The invention claimed is:

1. A non-volatile storage element comprising:
a first data terminal and a second data terminal;
a first MOS transistor and a second MOS transistor, the first MOS transistor and the second MOS transistor having a first conductivity type;
the first MOS transistor and the second MOS transistor having source terminals connected to a first voltage terminal;
the first MOS transistor having a drain terminal connected to the first data terminal;
the second MOS transistor having a drain terminal connected to the second data terminal;
the first MOS transistor having a gate terminal cross-connected to the drain terminal of the second MOS transistor;
the second MOS transistor having a gate terminal cross-connected to the drain terminal of the first MOS transistor;
a third MOS transistor and a fourth MOS transistor, the third MOS transistor and the fourth MOS transistor having floating gates and having a second conductivity type;
the third MOS transistor having a drain terminal connected to the first data terminal;
the fourth MOS transistor having a drain terminal connected to the second data terminal;
the third MOS transistor having a gate terminal cross-connected to the drain terminal of the fourth MOS transistor;
the fourth MOS transistor having a gate terminal cross-connected to the drain terminal of the third MOS transistor;
a fifth MOS transistor and a sixth MOS transistor having the second conductivity type;
the fifth MOS transistor and the sixth MOS transistor having source terminals connected to a second voltage terminal;
the fifth MOS transistor and the sixth MOS transistor having gate terminals connected to a first common switching line;
the fifth MOS transistor and the sixth MOS transistor having well terminals connected to a common control line configured to supply, to the well terminals, a programming voltage in a write mode and a first supply voltage in a read mode;
the fifth MOS transistor having a drain terminal connected to the source terminal of the third MOS transistor; and
the sixth MOS transistor having a drain terminal connected to the source terminal of the fourth MOS transistor.

2. The non-volatile storage element of claim 1, further comprising:
a seventh MOS transistor and an eighth MOS transistor, the seventh MOS transistor and the eighth MOS transistor having the second conductivity type;
the seventh MOS transistor and the eighth MOS transistor having gate terminals connected to the first common switching line;
the seventh MOS transistor and the eighth MOS transistor having well terminals connected to the common control line;
the seventh MOS transistor having source and drain terminals through which the third MOS transistor is connected to the first data terminal and the drain terminal of the first MOS transistor;
the eighth MOS transistor having source and drain terminals through which the fourth MOS transistor is connected to the second data terminal and the drain terminal of the second MOS transistor;
the drain terminal of the third MOS transistor being connected to a third data terminal to form a data output; and
the drain terminal of the fourth MOS transistor being connected to a fourth data terminal to form a data output.

3. The non-volatile storage element of claim 2, wherein:
the source terminal of the third MOS transistor is connected to a fifth data terminal; and
the source terminal of the fourth MOS transistor is connected to a sixth data terminal.

4. The non-volatile storage element of claim 2, further comprising:
a ninth MOS transistor having the first conductivity type, the ninth MOS transistor having a drain terminal connected to the first data terminal, the ninth MOS transistor having a source terminal connected to the second data terminal, and the ninth MOS transistor having a gate terminal connected to a second common switching line.

5. The non-volatile storage element of claim 2, further comprising:
a ninth MOS transistor and a tenth MOS transistor, the ninth MOS transistor and the tenth MOS transistor having the first conductivity type;
the ninth MOS transistor and the tenth MOS transistor having source terminals connected to the first voltage terminal;
the ninth MOS transistor and the tenth MOS transistor having gate terminals connected to a second common switching line;
the ninth MOS transistor having a drain terminal connected to the first data terminal; and
the tenth MOS transistor having a drain terminal connected to the second data terminal.

6. An arrangement comprising:
the non-volatile storage element of claim 1; and
logic connected to the third data terminal and the fourth data terminal;
wherein the logic is configured to detect a change in output signals at the third data terminal and the fourth data terminal.

7. An arrangement comprising:
the non-volatile storage element of claim 3; and
logic connected to the third data terminal and the fourth data terminal;
wherein the logic is configured to detect a change in output signals at the third data terminal and the fourth data terminal.

8. The arrangement of claim 6, further comprising:
a flip-flop;
the fourth data terminal being connected to a data input of the flip-flop;
an output of the logic connected to a clock input of the flip-flop;
a first output of the flip-flop connected via a first switch to the first data terminal and a fifth data terminal of the non-volatile storage element; and
a second, complementary output of the flip-flop is connected via a second switch to the second data terminal and a sixth data terminal of the non-volatile storage element.

9. The arrangement of claim 7, further comprising:
a flip-flop;
the fourth data terminal being connected to a data input of the flip-flop;
an output of the logic connected to a clock input of the flip-flop;
a first output of the flip-flop connected via a first switch to the first data terminal and the fifth data terminal of the non-volatile storage element; and
a second, complementary output of the flip-flop connected via a second switch to the second data terminal and the sixth data terminal of the non-volatile storage element.

10. An electronic storage element comprising:
a first data terminal and a second data terminal;
a first transistor and a second transistor, the first transistor and the second transistor having a first conductivity type;
the first transistor and the second transistor having first terminals connected to a first voltage terminal;
the first transistor having a second terminal connected to the first data terminal;
the second transistor having a second terminal connected to the second data terminal;
the first transistor having a third terminal cross-connected to the second terminal of the second transistor;
the second transistor having a third terminal cross-connected to the second terminal of the first transistor;
a third transistor and a fourth transistor, the third transistor and the fourth transistor having floating gates, first terminals, and a second conductivity type;
the third transistor having a second terminal connected to the first data terminal;
the fourth transistor having a second terminal connected to the second data terminal;
the third transistor having a third terminal cross-connected to the second terminal of the fourth transistor;
the fourth transistor having a third terminal cross-connected to the second terminal of the third transistor;
a fifth transistor and a sixth transistor having the second conductivity type;
the fifth transistor and the sixth transistor having first and second terminals, the first terminals of the fifth and sixth transistor being connected to a second voltage terminal;
the fifth transistor and the sixth transistor having third terminals connected to a first common switching line;
the fifth transistor and the sixth transistor having well terminals connected to a common control line configured to supply, to the well terminals, a programming voltage in a write mode and a first supply voltage in a read mode;
the second terminal of the fifth transistor being connected to the first terminal of the third transistor; and
the second terminal of the sixth transistor being connected to the first terminal of the fourth transistor.

11. The electronic storage element of claim 10, further comprising:
a seventh transistor and an eighth transistor, the seventh transistor and the eighth transistor having the second conductivity type;
the seventh transistor and the eighth transistor having well terminals connected to the common control line;
the seventh transistor having first and second terminals through which the third transistor is connected to the first data terminal and the second terminal of the first transistor;
the eighth transistor having first and second terminals through which the fourth transistor is connected to the second data terminal and the second terminal of the second transistor;
the seventh transistor and the eighth transistor having third terminals connected to the first common switching line;
the second terminal of the third transistor being connected to a third data terminal to form a data output; and
the second terminal of the fourth transistor being connected to a fourth data terminal to form a data output.

12. The electronic storage element of claim 11, wherein:
the first terminal of the third transistor is connected to a fifth data terminal; and
the first terminal of the fourth transistor is connected to a sixth data terminal.

13. The electronic storage element of claim 11, further comprising:
a ninth transistor having the first conductivity type, the ninth transistor having a second terminal connected to the first data terminal, the ninth transistor having a first terminal connected to the second data terminal, and the ninth transistor having a third terminal connected to a second common switching line.

14. The electronic storage element of claim 11, further comprising:
a ninth transistor and a tenth transistor, the ninth transistor and the tenth transistor having the first conductivity type;
the ninth transistor and the tenth transistor having first terminals connected to the first voltage terminal;
the ninth transistor having a second terminal connected to the first data terminal;
the tenth transistor having a second terminal connected to the second data terminal; and
the ninth transistor and the tenth transistor having third terminals connected to a second common switching line.

15. An arrangement comprising:
the non-volatile storage element of claim 10; and
logic connected to the third data terminal and the fourth data terminal;
wherein the logic is configured to detect a change in output signals at the third data terminal and the fourth data terminal.

16. The arrangement of claim 15, further comprising:
a flip-flop;
the fourth data terminal being connected to a data input of the flip-flop;
an output of the logic connected to a clock input of the flip-flop;

a first output of the flip-flop connected via a first switch to the first data terminal and a fifth data terminal of the electronic storage element; and a second, complementary output of the flip-flop connected via a second switch to the second data terminal and a sixth data terminal of the electronic storage element.

17. A non-volatile storage element comprising:

a first data terminal and a second data terminal;

a first transistor and a second MOS transistor, the first MOS transistor and the second MOS transistor having a first conductivity type;

the first MOS transistor and the second MOS transistor having source terminals connected to a first voltage terminal;

the first MOS transistor having a drain terminal connected to the first data terminal;

the second MOS transistor having a drain terminal connected to the second data terminal;

the first MOS transistor having a gate terminal cross-connected to the drain terminal of the second MOS transistor;

the second MOS transistor having a gate terminal cross-connected to the drain terminal of the first MOS transistor;

a third MOS transistor and a fourth MOS transistor, the third MOS transistor and the fourth MOS transistor having floating gates and having a second conductivity type;

the third MOS transistor having a drain terminal;

the fourth MOS transistor having a drain terminal;

the third MOS transistor having a gate terminal cross-connected to the drain terminal of the fourth MOS transistor;

the fourth MOS transistor having a gate terminal cross-connected to the drain terminal of the third MOS transistor;

a fifth MOS transistor and a sixth MOS transistor having the second conductivity type;

the fifth MOS transistor and the sixth MOS transistor having source terminals connected to a second voltage terminal;

the fifth MOS transistor and the sixth MOS transistor having gate terminals connected to a first common switching line;

the fifth MOS transistor and the sixth MOS transistor having well terminals connected to a common control line;

the fifth MOS transistor having a drain terminal connected to the source terminal of the third MOS transistor;

the sixth MOS transistor having a drain terminal connected to the source terminal of the fourth MOS transistor;

a seventh MOS transistor and an eighth MOS transistor, the seventh MOS transistor and the eighth MOS transistor having the second conductivity type;

the seventh MOS transistor and the eighth MOS transistor having gate terminals connected to the first common switching line;

the seventh MOS transistor and the eighth MOS transistor having well terminals connected to the common control line;

the seventh MOS transistor having source and drain terminals through which the third MOS transistor is connected to the first data terminal and the drain terminal of the first MOS transistor;

the eighth MOS transistor having source and drain terminals through which the fourth MOS transistor is connected to the second data terminal and the drain terminal of the second MOS transistor;

the drain terminal of the third MOS transistor being connected to a third data terminal to form a data output;

the drain terminal of the fourth MOS transistor being connected to a fourth data terminal to form a data output;

a ninth MOS transistor and a tenth MOS transistor, the ninth MOS transistor and the tenth MOS transistor having the first conductivity type;

the ninth MOS transistor and the tenth MOS transistor having source terminals connected to the first voltage terminal;

the ninth MOS transistor and the tenth MOS transistor having gate terminals connected to a second common switching line;

the ninth MOS transistor having a drain terminal connected to the first data terminal; and the tenth MOS transistor having a drain terminal connected to the second data terminal.

18. An electronic storage element comprising:

a first data terminal and a second data terminal;

a first transistor and a second transistor, the first transistor and the second transistor having a first conductivity type;

the first transistor and the second transistor having first terminals connected to a first voltage terminal;

the first transistor having a second terminal connected to the first data terminal;

the second transistor having a second terminal connected to the second data terminal;

the first transistor having a third terminal cross-connected to the second terminal of the second transistor;

the second transistor having a third terminal cross-connected to the second terminal of the first transistor;

a third transistor and a fourth transistor, the third transistor and the fourth transistor having floating gates, first terminals, and a second conductivity type;

the third transistor having a second terminal;

the fourth transistor having a second terminal;

the third transistor having a third terminal cross-connected to the second terminal of the fourth transistor;

the fourth transistor having a third terminal cross-connected to the second terminal of the third transistor;

a fifth transistor and a sixth transistor having the second conductivity type;

the fifth transistor and the sixth transistor having first and second terminals, the first terminals of the fifth and sixth transistors being connected to a second voltage terminal;

the fifth transistor and the sixth transistor having third terminals connected to a first common switching line;

the fifth transistor and the sixth transistor having well terminals connected to a common control line;

the second terminal of the fifth transistor being connected to the first terminal of the third transistor;

the second terminal of the sixth transistor being connected to the first terminal of the fourth transistor;

a seventh transistor and an eighth transistor, the seventh transistor and the eighth transistor having the second conductivity type;

the seventh transistor and the eighth transistor having well terminals connected to the common control line;

the seventh transistor having first and second terminals through which the third transistor is connected to the first data terminal and the second terminal of the first transistor;

the eighth transistor having first and second terminals through which the fourth transistor is connected to the second data terminal and the second terminal of the second transistor;

the seventh transistor and the eighth transistor having third terminals connected to the first common switching line;

the second terminal of the third transistor being connected to a third data terminal to form a data output;

the second terminal of the fourth transistor being connected to a fourth data terminal to form a data output; and a ninth transistor having the first conductivity type, the ninth transistor having a second terminal connected to the first data terminal, the ninth transistor having a first terminal connected to the second data terminal, and the ninth transistor having a third terminal connected to a second common switching line.

19. An electronic storage element comprising:

a first data terminal and a second data terminal;

a first transistor and a second transistor, the first transistor and the second transistor having a first conductivity type;

the first transistor and the second transistor having first terminals connected to a first voltage terminal;

the first transistor having a second terminal connected to the first data terminal;

the second transistor having a second terminal connected to the second data terminal;

the first transistor having a third terminal cross-connected to the second terminal of the second transistor;

the second transistor having a third terminal cross-connected to the second terminal of the first transistor;

a third transistor and a fourth transistor, the third transistor and the fourth transistor having floating gates, first terminals, and a second conductivity type;

the third transistor having a second terminal;

the fourth transistor having a second terminal;

the third transistor having a third terminal cross-connected to the second terminal of the fourth transistor;

the fourth transistor having a third terminal cross-connected to the second terminal of the third transistor;

a fifth transistor and a sixth transistor having the second conductivity type;

the fifth transistor and the sixth transistor having first and second terminals, the first terminals of the fifth and sixth transistors being connected to a second voltage terminal;

the fifth transistor and the sixth transistor having third terminals connected to a first common switching line;

the fifth transistor and the sixth transistor having well terminals connected to a common control line;

the second terminal of the fifth transistor being connected to the first terminal of the third transistor;

the second terminal of the sixth transistor being connected to the first terminal of the fourth transistor;

a seventh transistor and an eighth transistor, the seventh transistor and the eighth transistor having the second conductivity type;

the seventh transistor and the eighth transistor having well terminals connected to the common control line;

the seventh transistor having first and second terminals through which the third transistor is connected to the first data terminal and the second terminal of the first transistor;

the eighth transistor having first and second terminals through which the fourth transistor is connected to the second data terminal and the second terminal of the second transistor;

the seventh transistor and the eighth transistor having third terminals connected to the first common switching line;

the second terminal of the third transistor being connected to a third data terminal to form a data output;

the second terminal of the fourth transistor being connected to a fourth data terminal to form a data output;

a ninth transistor and a tenth transistor, the ninth transistor and the tenth transistor having the first conductivity type;

the ninth transistor and the tenth transistor having first terminals connected to the first voltage terminal;

the ninth transistor having a second terminal connected to the first data terminal;

the tenth transistor having a second terminal connected to the second data terminal; and the ninth transistor and the tenth transistor having third terminals connected to a second common switching line.

20. The electronic storage element of claim 19, wherein:

the first terminal of the third transistor is connected to a fifth data terminal; and the first terminal of the fourth transistor is connected to a sixth data terminal.

* * * * *

UNITED STATES PATENT AND TRADEMARK OFFICE
CERTIFICATE OF CORRECTION

PATENT NO. : 7,602,640 B2  Page 1 of 1
APPLICATION NO. : 11/576082
DATED : October 13, 2009
INVENTOR(S) : Gregor Schatzberger It is certified that error appears in the above-identified patent and that said Letters Patent is hereby corrected as shown below:

Column 10, Claim 1, Line 1:
Delete "wall" and Insert --well--

Column 11, Claim 8, Line 17:
Delete "is" after "flip-flop"

Column 11, Claim 10, Line 63:
Delete "transistor" and Insert --transistors--

Column 13, Claim 17, Line 9:
Delete "first" and Insert --first MOS--

Column 13, Claim 17, Line 47:
Delete "MO S" and Insert --MOS--

Signed and Sealed this

Nineteenth Day of January, 2010

David J. Kappos
*Director of the United States Patent and Trademark Office*